(12) United States Patent
Chae et al.

(10) Patent No.: US 6,458,701 B1
(45) Date of Patent: Oct. 1, 2002

(54) METHOD FOR FORMING METAL LAYER OF SEMICONDUCTOR DEVICE USING METAL HALIDE GAS

(75) Inventors: Yun-sook Chae, Suwon; Sang-bom Kang, Seoul; Gil-heyun Choi, Seongnam; In-sang Jeon, Seoul, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 35 days.

(21) Appl. No.: 09/686,622

(22) Filed: Oct. 12, 2000

(30) Foreign Application Priority Data

Oct. 20, 1999 (KR) .............................. 99-45561

(51) Int. Cl.[7] .............................. C23L 16/08
(52) U.S. Cl. .................. 438/680; 438/683; 438/685; 427/253; 427/255.39; 427/255.391; 427/255.393; 427/255.394
(58) Field of Search .............. 427/255.39, 255.391, 427/255.393, 255.394, 253; 438/680, 683, 685

(56) References Cited

U.S. PATENT DOCUMENTS 5,393,565 A * 2/1995 Suzuki et al. ............ 427/126.1
6,284,316 B1 * 9/2001 Sandhu et al. ............. 427/124

* cited by examiner

Primary Examiner—Timothy Meeks
(74) Attorney, Agent, or Firm—Lee & Sterba, P.C.

(57) ABSTRACT

A method for forming a metal layer located over a metal underlayer of a semiconductor device, using a metal halogen gas. The method involves supplying a predetermined reaction gas into a reaction chamber for a predetermined period of time prior to deposition of the metal layer. The reaction gas has a higher reactivity with an active halogen element of a metal halogen gas supplied to form the metal layer, compared to a metal element of the metal halogen gas. As the metal halogen gas is supplied into the reaction chamber, the reaction gas reacts with the halogen radicals of the metal halogen gas, so that the metal underlayer is protected from being contaminated by impurities containing the halogen radicals.

10 Claims, 3 Drawing Sheets

METHOD FOR FORMING METAL LAYER OF SEMICONDUCTOR DEVICE USING METAL HALIDE GAS

BACKGROUND OF THE INVENTION

1. Field of the Invention

The present invention relates to a method for forming a metal layer of a semiconductor device, and more particularly, to a method for forming a metal layer of a semiconductor device using a metal halide gas.

2. Description of the Related Art

As the density of semiconductor devices increases, the design rule gradually decreases. Accordingly, the aspect ratio of contact holes increases while the junction depth becomes shallow. The junction depth is closely associated with a short channel effect of MOS transistors. In particular, MOS transistors suitable for high integration semiconductor devices need a short channel. In addition, to improve the characteristics of a MOS transistor with such a short channel, the depth of a source/drain region, i.e., the junction depth, must be formed to be shallow. An interconnection technology to achieve a shallow junction employs a metal barrier layer to prevent junction sparking where a metal interconnection penetrates the shallow junction. Also, an ohmic layer is interposed between the metal barrier layer and the junction.

Commonly, the ohmic layer is formed of Ti and the metal barrier layer is formed of TiN. These layers are formed by chemical vapor deposition (CVD). For the CVD, $TiCl_4$ gas is used as a metal source gas. However, if the TiN layer is formed using $TiCl_4$ gas, the $TiCl_4$ gas may react with the Ti layer, which is underneath the TiN layer, thereby resulting in chlorine (Cl)-containing lumps on the Ti layer. To solve this problem, after the deposition of Ti layer and before the deposition of the TiN layer, the surface of the Ti layer may be nitrified. As a result, the overall process is complicated. Furthermore, if the Ti layer is too thick, the Ti layer corrodes even though the nitridation is performed.

SUMMARY OF THE INVENTION

To solve the above problems, it is an objective of the present invention to provide a method for forming a metal layer of a semiconductor device using a metal halogen gas, in which a metal underlayer formed underneath the metal layer can be protected from degrading by a halogen component of the metal halogen gas.

According to an aspect of the present invention, a method for forming a metal layer of a semiconductor device, comprises forming a metal underlayer on a semiconductor substrate; supplying a reaction gas having a higher reactivity with an active halogen element of a metal halogen gas, than a metal component of the metal halogen gas, into a reaction chamber; and supplying the metal halogen gas into the reaction chamber to deposit the metal layer over the metal underlayer.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE PREFERRED EMBODIMENTS

Korean Patent Application No. 99-45561, filed Oct. 20, 1999, and entitled: "Method for forming metal layer of semiconductor device using metal halide gas" is incorporated by reference herein in its entirety.

Figure 2:
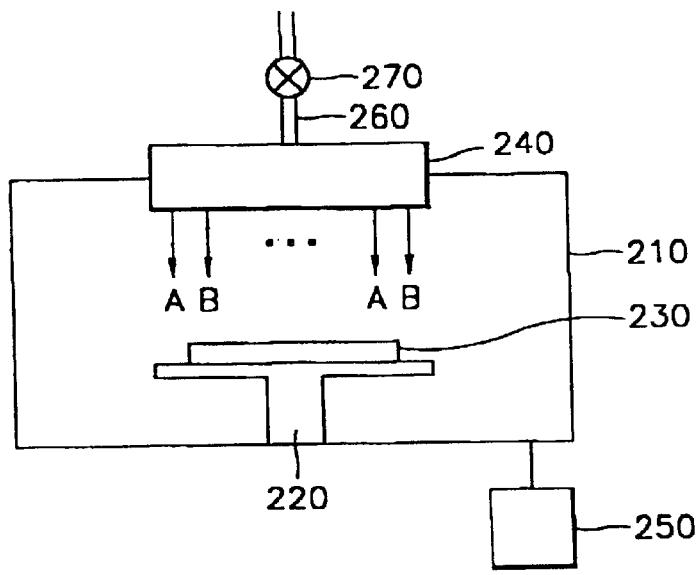
FIG. 2 is a schematic view of an apparatus for use in the formation of a metal layer of a semiconductor device according to a preferred embodiment of the present invention.

FIG. 2 shows an apparatus for use in forming a metal layer of a semiconductor device according to a preferred embodiment of the present invention. The apparatus includes a reaction chamber 210, a susceptor 220 installed at the bottom of the reaction chamber 210 to receive a semiconductor wafer 230, a showerhead 240 installed over the susceptor 220, through which reaction gases are provided into the reaction chamber 210, and a vacuum pump 250 connected to the reaction chamber 210, for adjusting the internal pressure of the reaction chamber 210. A gas inlet tube 260 is connected to the showerhead 240, and guides the introduction of a variety of gases including a metal source gas into the reaction chamber 210 through the showerhead 240. A valve 270 is installed at the gas inlet tube 260, and controls the amount of gases supplied into the reaction chamber 210 through the gas inlet tube 260. Although only a single gas inlet tube 260 is illustrated in FIG. 2, of course a plurality of gas inlet tubes may be connected to the showerhead 240 such that a variety of gases are allowed to enter the reaction chamber 210 through different gas inlet tubes.

Figure 1:
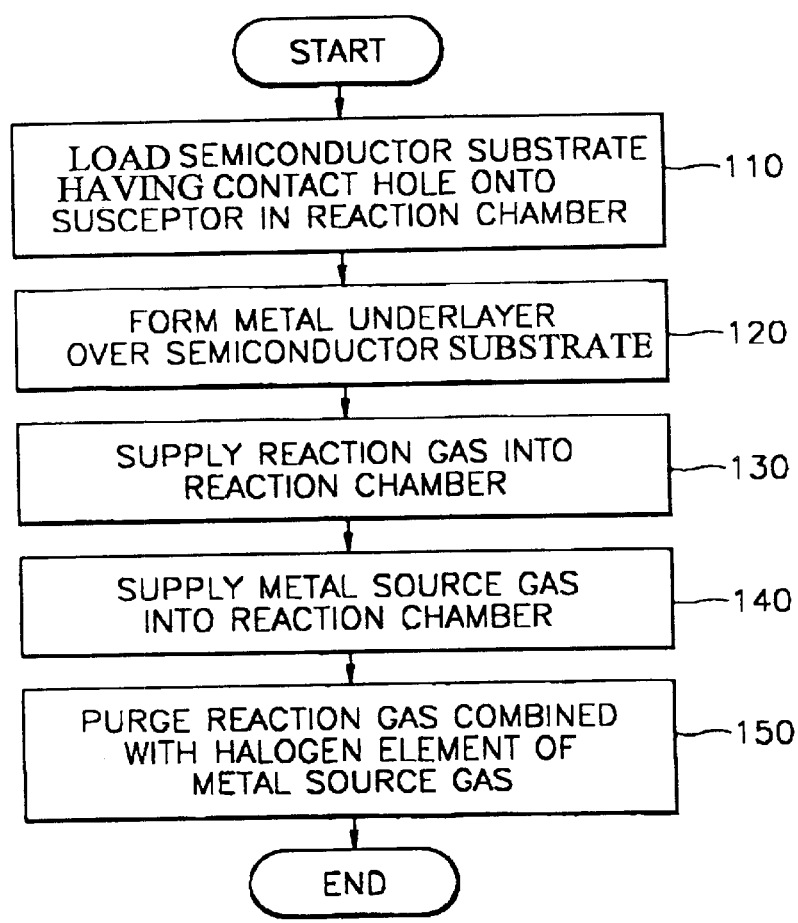
FIG. 1 is a flowchart illustrating a method for forming a metal layer of a semiconductor device according to a preferred embodiment of the present invention.

A preferred method for forming a metal layer will be described with reference to FIGS. 1 and 2. First, a junction doped with impurity, i.e., an impurity layer, is formed in a predetermined region of a semiconductor substrate, for example, a silicon substrate. The impurity layer corresponds to a source/drain region of a MOS transistor. For a high-density integration semiconductor device, the impurity layer is formed to be shallow less than 0.1 $\mu$m or less, because the short channel effect of MOS transistor is closely associated with junction depth. As the junction depth of the impurity layer is smaller, the short channel effect of MOS transistor improves.

Next, an interlevel dielectric (ILD) layer is formed over the resultant structure having the impurity layer, and the ILD layer is patterned to form a contact hole exposing a predetermined region of the impurity layer. As the integration density of semiconductor device increases, the thickness of the ILD layer increases and the diameter of contact hole decreases. The semiconductor substrate 230 with the contact hole is loaded on the susceptor 220 of the reaction chamber 210 shown in FIG. 2 (step 110).

A metal source gas, an inert gas and a reducing gas are provided into the reaction chamber 210 through the gas inlet tube 260 for a predetermined period of time, so that a metal underlayer as an ohmic layer is formed over the semiconductor substrate 230 having the contact hole (step 120). The metal underlayer is formed of a refractory metal layer containing titanium (Ti), cobalt (Co) and nickel (Ni), or a refractory metal silicide layer such as titanium silicide ($TiSi_2$) and cobalt silicide ($CoSi_2$). A metal halogen gas can be used as the metal source gas. For example, if the metal underlayer is formed of a Ti layer, $TiCl_4$ gas can be used as the metal source gas.

Thereafter, a reaction gas having a high reactivity with active halogen elements, for example, halogen ions or halogen radicals, is supplied into the reaction chamber 210 for a predetermined period of time (step 130). The reaction gas should easily react with an active halogen element of the metal halogen source gas supplied during a subsequent formation of a metal layer over the metal underlayer, thereby preventing the active halogen element from reacting with the metal underlayer. Thus, the reaction gas should have a higher binding force with halogen element than that of the metal of the metal halogen source gas. For reference, the Gibbs free energy at 427° C. for a variety of chlorine based gaseous compounds is shown in Tables 1A and 1B.

As shown in Tables 1A and 1B, $TiCl_4$ has the Gibbs free energy as high as 678.3 kJ/mol at 427° C. For $TiCl_4$ having a high Gibbs free energy, it is not easy to break the bond between Ti and Cl. To break the bond between Ti and Cl, a compound having a higher Gibbs free energy than $TiCl_4$ must be supplied. Tables 1A and 1B show that aluminum (Al), thorium (Th), uranium (U), hafnium (Hf), zirconium (Zr), lanthanum (La), praseodymium (Pr), indium (In), cerium (Ce), neodymium (Nd) and beryllium (Be) can compose such compounds having a higher Gibbs free energy than $TiCl_4$. These metal elements can be present in a gaseous form in combination with Cl at a low temperature of 427° C. In other words, these metal elements are easy to bind with Cl to produce gases, compared to the metal underlayer, and thus the gaseous metal elements can be purged without being deposited over the metal underlayer.

As the gas for the reaction with active halogen elements, an organic metal precursor containing one of the metal elements and without including oxygen and chlorine can be used. A variety of organic metal precursors can be used. For example, an organic metal precursor containing Al, having the highest binding force with Cl, may include diisobutyla-luminum hydride (($C_4H_9)_2AlH$), triisobutylaluminum (($C_4H_9)_3Al$), triethylaluminum (($C_2H_5)_3Al$), trimethylaluminum (($CH_3)_3Al$), trimethylamine ($AlH_3N(CH_3)_3$), dim-

TABLE 1A

| Compound | Gibbs Free Energy | Compound | Gibbs Free Energy | Compound | Gibbs Free Energy |
| --- | --- | --- | --- | --- | --- |
| $Al_2Cl_6$ | −1121.9 | $HfCl_3$ | −626.7 | $BeCl_2$ | −373.1 |
| $ThCl_4$ | −895.8 | $EuCl_3$ | −621.6 | $BCl_3$ | −367.7 |
| $UCl_5$ | −811.9 | $YbCl_3$ | −621.5 | $SiCl_3$ | −365.7 |
| $HfCl_4$ | −804.7 | $K_2Cl_2$ | −609.8 | $SnCl_4$ | −362.3 |
| $ZrCl_4$ | −777.6 | $Rb_2Cl_2$ | −607.6 | $InCl_3$ | −335.8 |
| $LaCl_3$ | −708.9 | $Li_2Cl_2$ | −597.8 | $AlCl_2$ | −305.5 |
| $PrCl_3$ | −706.9 | $SiCl_4$ | −569.6 | $TaCl_3$ | −300.1 |
| $In_2Cl_6$ | −703.7 | $AlCl_3$ | −550.1 | $GeCl_3$ | −299.8 |
| $CeCl_3$ | −699.5 | $Fe_2Cl_6$ | −526.8 | $MnCl_2$ | −286.4 |
| $NdCl_3$ | −696.6 | $BaCl_2$ | −524.3 | $WCl_5$ | −285.6 |
| $Be_2Cl_4$ | −692.6 | $SrCl_2$ | −498.1 | $CsCl$ | −276.7 |
| $TiCl_4$ | −678.3 | $TaCl_4$ | −497.5 | $ZnCl_2$ | −273.5 |
| $GdCl_3$ | −674.3 | $CaCl_2$ | −489.1 | $WCl_4$ | −267.6 |
| $TbCl_3$ | −668.1 | $PbCl_4$ | −462.1 | $Ti_2Cl_2$ | −259.8 |
| $HoCl_3$ | −659.7 | $VaCl_4$ | −447.2 | $GaCl_2$ | −258.4 |
| $ErCl_3$ | −651.7 | $GeCl_4$ | −410.8 | $SbCl_5$ | −249.9 |
| $Cs_2Cl_2$ | −644.1 | $MgCl_2$ | −407.8 | $Cu_3Cl_3$ | −249.9 |
| $TmCl_3$ | −641.5 | $Fe_2Cl_4$ | −406.5 | $PCl_3$ | −242.3 |
| $TaCl_5$ | −636.6 | $GaCl_3$ | −388.6 | $FeCl_3$ | −240.6 |

TABLE 1B

| Compound | Gibbs Free Energy | Compound | Gibbs Free Energy | Compound | Gibbs Free Energy |
| --- | --- | --- | --- | --- | --- |
| $InCl_2$ | −240.2 | $CaCl$ | −165.1 | $NiCl_2$ | −101.8 |
| $BiCl_3$ | −238.5 | $TeCl_4$ | −136.4 | $HCl$ | −98.7 |
| $AsCl_3$ | −231.4 | $HgCl_2$ | −136.2 | $SeCl_2$ | −50.5 |
| $SnCl_2$ | −215.8 | $TeCl_2$ | −134.6 | $BiCl$ | −30.9 |
| $BaCl$ | −198.5 | $CoCl_2$ | −125.2 | $BeCl$ | −6.2 |
| $SiCl_2$ | −195.5 | $GaCl$ | −123.1 | $AgCl$ | 29.6 |
| $SrCl$ | −181.5 | $AlCl$ | −111.6 | $BCl$ | 74.3 |
| $FeCl_2$ | −174.5 | $BCl_2$ | −109.9 | $SiCl$ | 123.7 | ethylaluminum hydride (($CH_3)_2AlH$) and dimethylethylamine alane (($CH_3)_2C_2H_5N:AlH_3$). A La-based organic metal precursor may include triscyclopentadienyl lanthanum (($C_5H_5)_3La$) and trisisopropylcyclopentadienyl lanthanum (($C_2H_7C_4H_4)_3La$). A Pr-based organic metal precursor may include triscyclopentadienyl praseodymium (($C_5H_5)_3Pr$) and trisisopropylcyclopendienyl praseodymium ($C_3H_7C_5H_4)_3Pr$). An In-based organic metal precursor may include cyclopentadienyl indium ($C_2H_5In$), pentamethylcyclopendienyl indium (($CH_3)_5C_5In$), triethyl indium (($C_2H_5)_3$In) and trimethyl indium (($CH_3)_3In$). A Ce-based organic metal precursor may include triscyclopentadienyl cerium (($C_5H_5)_3Ce$) and trisisopropylcyclopentadienyl cerium (($C_5H_5)C_5H_4)_3Ce$). An Nd-based organic metal precursor may include triscyclopentadienyl neodymium (($C_5H_5)_3Nd$) and trisisopropylcyclopentadienyl neodymium (($C_3H_7C_5H_4)_3Nd$). A Be-based organic metal precursor may be diethyl beryllium.

The period of time for which the organic metal precursor is supplied is related with the thickness of the metal underlayer. For a thin metal underlayer, the organic metal precursor is supplied for a short period of time. For a thick metal underlayer, the organic metal precursor supply period of time is increased. For example, if the metal underlayer having a thickness of 300 Å is formed of a Ti layer and a metal layer of TiAlN is formed over the metal underlayer, an organic metal precursor can be supplied for approximately 1 second. If the metal underlayer has a thickness of 500 Å, the organic metal precursor is supplied for approximately 3 seconds.

After the organic metal precursor is supplied into the reaction chamber 210 for a predetermined period of time, a metal source gas including a metal halide is supplied into the reaction chamber 210 to deposit a metal layer (step 140). Here, ammonia ($NH_3$) gas, hydrogen ($H_2$) gas, argon (Ar) gas and nitrogen ($N_2$) gas may be further supplied along with the metal source gas. As the metal source gas is supplied into the reaction chamber 210, the metal layer is deposited over the metal underlayer. During the deposition of the metal layer, the active halogen element of the metal source gas reacts with the metal component of the organic metal precursor left in the reaction chamber 210, and produces a gaseous byproduct.

Next, the gaseous byproduct is purged out of the reaction chamber 210 (step 150). As a result, deterioration of the metal underlayer during the formation of the metal layer over the metal underlayer, due to the halogen component of the metal source gas, can be prevented.

Figure 3:
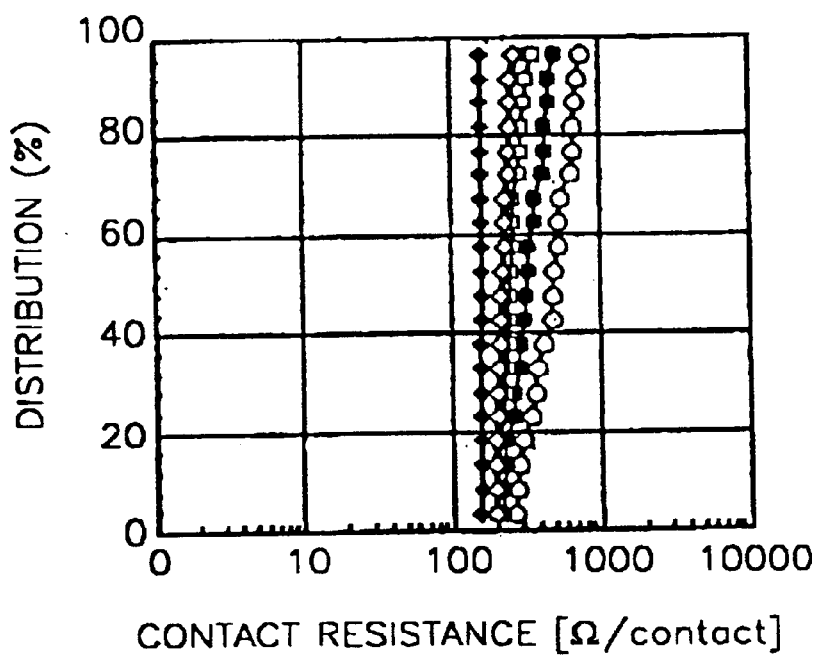
FIGS. 3 and 4 are graphs showing the contact resistance of a metal layer formed by the inventive method.
Figure 4:
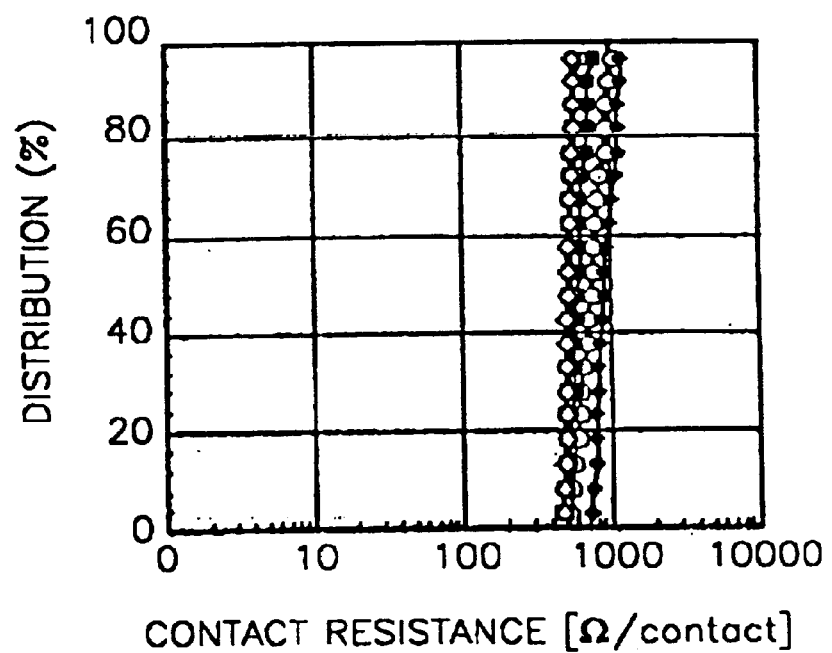

FIGS. 3 and 4 are graphs illustrating the contact resistance of a metal layer formed by a preferred method. In particular, FIG. 3 illustrates a case where metal interconnection is formed on a $N^+$ region, and FIG. 4 illustrates a case where metal interconnection is formed on a $P^+$ region.

In FIGS. 3 and 4, -○- indicates when the contact hole has a diameter of 0.30 μm, -•- indicates when the contact hole has a diameter of 0.32 μm, -□- indicates when the contact hole has a diameter of 0.35 μm, -■- indicates when the contact hole has a diameter of 0.37 μm, -◇- indicates when the contact hole has a diameter of 0.40 μm, and -◆- indicates when the contact hole has a diameter of 0.62 μm. For the measurement of contact resistance, the metal underlayer was formed of Ti layer with a thickness of 400 Å, and the metal layer over the metal underlayer was formed of a TiAlN layer with a thickness of 300 Å by sequential layer deposition. After the formation of each of the metal underlayer and the metal layer, a rapid thermal process was carried out. A metal interconnection layer was formed of tungsten (W).

As shown in FIG. 3, when the metal interconnection is formed on the $N^+$ region, the contact resistance ranges between 200 and 1000 Ω/contact. As shown in FIG. 4, when the metal interconnection is formed on the $P^+$ region, the contact resistance ranges between 500 and 1000 Ω/contact. For each case, the values of contact resistance is favorable. Thus, a preferred method for forming a metal thin layer can prevent the deterioration of the electrical characteristics of the metal interconnection.

Figure 5:
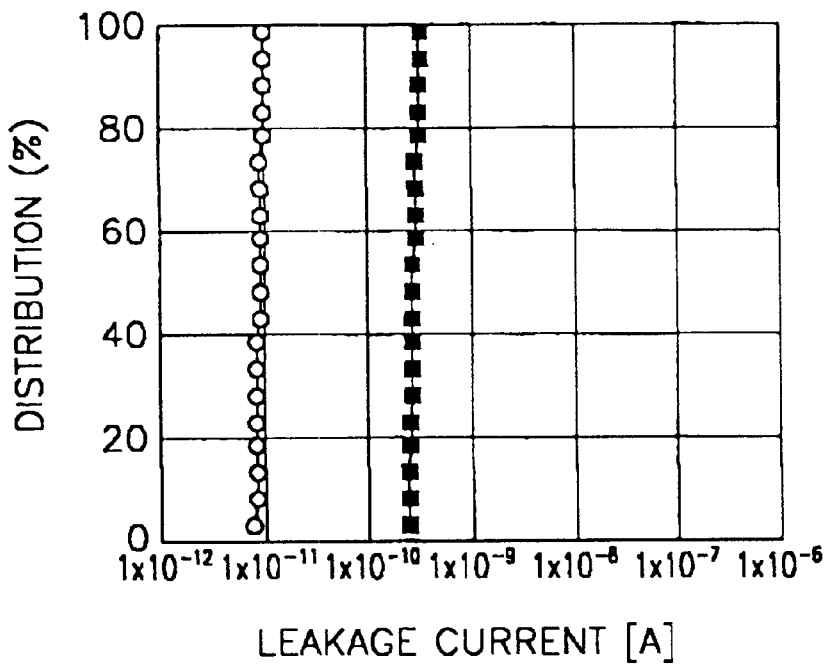
FIGS. 5 and 6 are graphs showing the leakage current in a metal layer formed by a preferred method.
Figure 6:
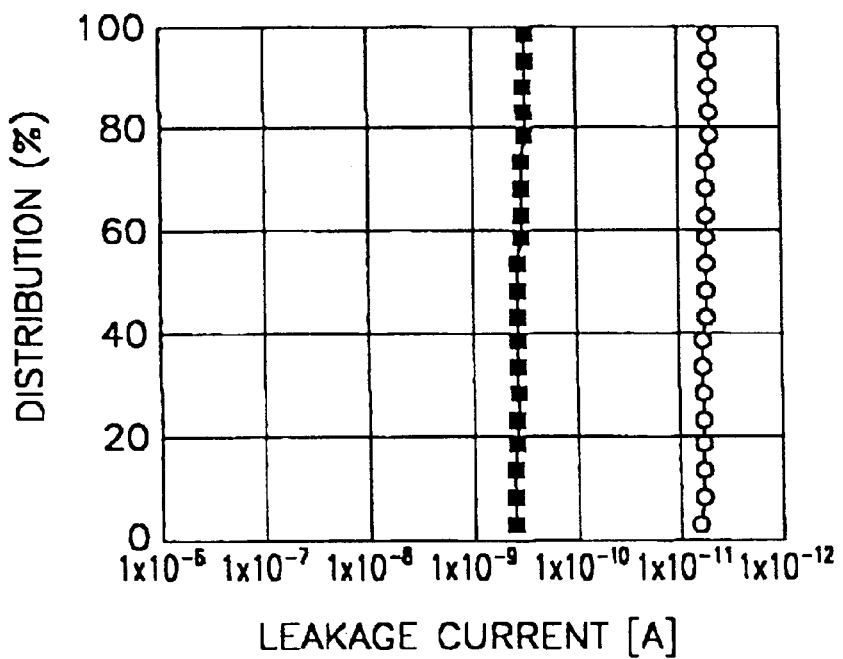

FIGS. 5 and 6 are graphs illustrating the leakage current of a metal layer formed by a preferred method. In particular, FIG. 5 illustrates a case where metal interconnection is formed on a $N^+$ region, and FIG. 6 illustrates a case where metal interconnection is formed on a $P^+$ region.

In FIGS. 5 and 6, -○- indicates the leakage current in the active region, and -■- indicates the leakage current in the peripheral circuit region. For this measurement, the metal underlayer was formed of Ti layer with a thickness of 400 Å, and the metal layer over the metal underlayer was formed of a TiAlN layer with a thickness of 300 Å by sequential layer deposition. After the formation of each of the metal underlayer and the metal layer, a rapid thermal process was carried out. A metal interconnection layer was formed of tungsten (W).

When the metal interconnection is formed on the $N^+$ region, as shown in FIG. 5, the leakage current is approximately $1 \times 10^{-11}$ A in the active region, and is approximately $3 \sim 5 \times 10^{-10}$ A in the peripheral circuit region. On the other hand, when the metal interconnection is formed on the $P^+$ region, as shown in FIG. 6, the leakage current is approximately $2 \sim 3 \times 10^{-11}$ A in the active region, and is approximately $4 \sim 6 \times 10^{-9}$ A in the peripheral circuit region. Thus, it can be concluded that a preferred method does not greatly change the leakage current.

In summary, there is provided a method for forming a metal layer over a metal underlayer of a semiconductor device, using a metal halogen gas. The method includes supplying a reaction gas having a higher reactivity with an active halogen element of a metal halogen gas, than a metal component of the metal halogen gas, into a reaction chamber for a predetermined period of time, before deposition of the metal layer. The reaction gas easily reacts with the halogen radicals of the metal halogen gas during the formation of the metal layer, thereby preventing the metal underlayer from being contaminated by impurities including the halogen radicals.

Preferably, the metal underlayer is formed of a refractory metal layer or a refractory metal silicide layer. It is more preferable that the refractory metal layer is a titanium (Ti) layer, a cobalt (Co) layer or a nickel (Ni) layer, and the refractory metal silicide layer is a titanium silicide ($TiSi_2$) layer or a cobalt silicide ($CoSi_2$) layer.

Preferably, the metal layer is formed of a Ti layer, a TiN layer, a TiAlN layer or a TiSiN layer. If the metal layer is formed of a Ti layer, $TiCl_4$ gas may be supplied as the metal halogen gas. For this case, the reaction gas may be an organic metal precursor containing aluminum (Al), thorium (Th), uranium (U), hafnium (Hf), zirconium (Zr), lanthanum (La), praseodymium (Pr), indium (In), cerium (Ce), neodymium (Nd) or beryllium (Be).

Preferably, the organic metal precursor containing Al comprises diisobutylaluminum hydride $((C_4H_9)_2AlH)$, triisobutylaluminum $((C_4H_9)_3Al)$, triethylaluminum $((C_2H_5)_3Al)$, trimethylaluminum $((CH_3)_3Al)$, trimethylamine $(AlH_3N(CH_3)_3)$, dimethylaluminum hydride $((CH_3)_2AlH)$ and dimethylethylamine alane $((CH_3)_2C_2H_5N:AlH_3)$. Preferably, the organic metal precursor containing La comprises triscyclopentadienyl lanthanum $((C_5H_5)_3La)$ and trisisopropylcyclopentadienyl lanthanum $((C_2H_7C_4H_4)_3La)$. Preferably, the organic metal precursor containing Pr comprises triscyclopentadienyl praseodymium $((C_5H_5)_3Pr)$ and trisisopropylcyclopendienyl praseodymium $((C_3H_7C_5H_4)_3Pr)$. Preferably, the organic metal precursor containing In comprises cyclopentadienyl indium $(C_2H_5In)$, pentamethylcyclopendienyl indium $((CH_3)_5C_5In)$, triethyl indium $((C_2H_5)_3In)$ and trimethyl indium $((CH_3)_3In)$. Preferably, the organic metal precursor containing Ce comprises triscyclopentadienyl cerium $((C_5H_5)_3Ce)$ and trisisopropylcyclopentadienyl cerium $((C_5H_5)C_5H_4)_3Ce)$. Preferably, the organic metal precursor containing Nd comprises triscyclopentadienyl neodymium $((C_5H_5)_3Nd)$ and trisisopropylcyclopentadienyl neodymium $((C_3H_7C_5H_4)_3Nd)$. Preferably, the organic metal precursor containing Be comprises diethyl beryllium.

As described above, a predetermined gas, able to react with halogen radicals of a metal halogen source gas during deposition of the metal layer, is supplied for a predetermined period of time prior to the deposition of the metal layer. The reaction gas has a higher reactivity with an active halogen element of a metal halogen gas supplied to form the metal layer, compared to a metal element of the metal halogen gas. As the metal halogen gas is supplied into the reaction chamber, the reaction gas reacts with the halogen radicals of the metal halogen gas, so that the metal underlayer is protected from being contaminated by impurities containing the halogen radicals. As a result, the metal underlayer can be protected from being contaminated by impurities including the halogen radicals of the metal halogen gas.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims.

What is claimed is:

1. A method for forming a metal layer of a semiconductor device, comprising:

forming a metal underlayer on a semiconductor substrate;

supplying a reaction gas having a higher reactivity with an active halogen element of a metal halogen gas, then a metal component of the metal halogen gas, wherein supplying the reaction gas includes supplying an organic metal precursor containing triscyclopentadienyl lanthanum, trisisopropylcyclopentadienyl lanthanum triscyclopentadienyl praseodymium, trisisopropylcyclopentadienyl praseodymium, triscyclopentadienyl cerium, trisisopropylcyclopentadienyl cerium, triscyclopentadienyl neodymium, trisisopropylcyclopentadienyl neodymium, or diethyl beryllium, into a reaction chamber; and supplying the metal halogen gas into the reaction chamber to deposit the metal layer over the metal underlayer.

2. The method of claim 1, wherein supplying the reaction gas includes supplying an organic metal precursor containing triscyclopentadienyl praseodymium or trisisopropylcyclopentadienyl praseodymium.

3. The method of claim 2, wherein supplying the metal halogen gas includes supplying the metal halogen gas to form a metal layer including a Ti layer, a TiN layer, a TiAlN layer or a TiSiN layer.

4. The method of claim 1, wherein supplying the reaction gas includes supplying an organic metal precursor containing triscyclopentadienyl cerium or trisisopropylcyclopentadienyl cerium.

5. The method of claim 4, wherein supplying the metal halogen gas includes supplying the metal halogen gas to form a metal layer including a Ti layer, a TiN layer, a TiAlN layer or a TiSiN layer.

6. The method of claim 1, wherein supplying the reaction gas includes supplying an organic metal precursor containing triscyclopentadienyl neodymium or trisisopropylcyclopentadienyl neodymium.

7. The method of claim 6, wherein supplying the metal halogen gas includes supplying the metal halogen gas to form a metal layer including a Ti layer, a TiN layer, a TiAlN layer or a TiSiN layer.

8. The method of claim 1, wherein supplying the reaction gas includes supplying an organic metal precursor containing diethyl beryllium.

9. The method of claim 8, wherein supplying the metal halogen gas includes supplying the metal halogen gas to form a metal layer including a Ti layer, a TiN layer, a TiAlN layer or a TiSiN layer.

10. The method of claim 1, wherein supplying the metal halogen gas includes supplying the metal halogen gas to form a metal layer including a Ti layer, a TiN layer, a TiAlN layer or a TiSiN layer.

* * * * *